(12) United States Patent
Weng

(10) Patent No.: US 10,355,680 B2
(45) Date of Patent: Jul. 16, 2019

(54) FREQUENCY ADJUSTING DEVICE AND METHOD FOR ADJUSTING FREQUENCY

(71) Applicant: MStar Semiconductor, Inc., Hsinchu Hsien (TW)

(72) Inventor: Meng-Tse Weng, Hsinchu Hsien (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 15/452,924

(22) Filed: Mar. 8, 2017

(65) Prior Publication Data

US 2018/0062627 A1 Mar. 1, 2018

(30) Foreign Application Priority Data

Sep. 1, 2016 (TW) .............................. 105128211 A

(51) Int. Cl.
| | |
|---|---|
| *H03K 19/21* | (2006.01) |
| *H03K 5/1252* | (2006.01) |
| *H03K 5/131* | (2014.01) |
| *H03K 21/02* | (2006.01) |
| *H03K 5/00* | (2006.01) |

(52) U.S. Cl.
CPC ........... *H03K 5/1252* (2013.01); *H03K 5/131* (2013.01); *H03K 19/21* (2013.01); *H03K 21/026* (2013.01); *H03K 2005/00058* (2013.01)

(58) Field of Classification Search
CPC .... H03K 5/1252; H03K 5/131; H03K 21/026; H03K 19/21; H03K 2005/00058
See application file for complete search history.

(56) References Cited

U.S. PATENT DOCUMENTS

| | | | |
|---|---|---|---|
| 6,888,413 B1 | 5/2005 | Adams et al. | |
| 7,701,796 B2 | 4/2010 | Kim | |
| 7,876,585 B2 | 1/2011 | Wang | |
| 8,854,086 B1 * | 10/2014 | Bal ........................ | H03K 3/012 327/99 |
| 8,933,737 B1 * | 1/2015 | Chatterjee ............... | H03L 7/095 327/149 |
| 2004/0183613 A1 * | 9/2004 | Kurd ........................ | G01K 7/32 331/186 |

FOREIGN PATENT DOCUMENTS

JP 63113366 A * 5/1988 ............. G01R 29/02

OTHER PUBLICATIONS

Jia, et al., "Design of Low-Power High-Speed Divide-by 2/3 Prescalers with Improved True Single-Phase Clock Scheme", Proceedings of Asia-Pacific Microwave Conference 2014, pp. 241-243.

* cited by examiner

*Primary Examiner* — Jung Kim
(74) *Attorney, Agent, or Firm* — McClure, Qualey & Rodack, LLP

(57) ABSTRACT

A frequency adjusting device includes a voltage droop detector and a frequency divider. The voltage droop detector compares a supply voltage with a lower threshold voltage to output a comparison result. When the supply voltage is greater than the threshold voltage, the frequency divider outputs a result of dividing a basic clock signal by a first value as a clock signal. When the supply voltage is smaller than the threshold voltage, the frequency divider outputs a result of dividing the basic clock signal by a second value as the clock signal.

3 Claims, 8 Drawing Sheets

FREQUENCY ADJUSTING DEVICE AND METHOD FOR ADJUSTING FREQUENCY

This application claims the benefit of Taiwan application Serial No. 105128211, filed Sep. 1, 2016, the subject matter of which is incorporated herein by reference.

BACKGROUND OF THE INVENTION

Field of the Invention

The invention relates in general to a semiconductor chip, and more particularly to a semiconductor chip with frequency adjusting capabilities.

Description of the Related Art

Complicated digital circuit systems may be realized in a semiconductor chip. A common digital circuit system needs a clock signal to perform synchronous operations. As the industry demands more and more sophisticated product functions, the clock signal of digital circuits needs to be persistently increased. Such demand is similarly apparent for central processing units. To achieve a high-speed clock, a supply voltage provided to a digital circuit system is required to be quite stable, otherwise an unstable supply voltage provided to a digital circuit system may cause delay and errors of the digital circuit system. However, actual ambient environmental factors may cause an unstable supply voltage. For example, a noise of a circuit board connected to the chip may produce temporary a voltage disturbance or voltage droop on the voltage provided to the digital circuit system. Therefore, for a chip designer, there is a need for a device capable of promptly respond to a voltage disturbance or voltage droop to allow a digital circuit system to operate stably without errors.

SUMMARY OF THE INVENTION

It is an object of the present invention to provide a frequency adjusting device. When a supply voltage abruptly drops or becomes unstable, the frequency adjusting device is capable of promptly down-converting a basic clock signal to maintain normal operations of a subsequent digital circuit.

It is another object of the present invention to provide a frequency adjusting device capable of suppressing surges or noises when a basic clock signal is down-converted.

It is another object of the present invention to provide a frequency adjusting device capable of flexibly adjusting a lower threshold voltage according to a critical path of a subsequent digital circuit.

A frequency adjusting device is provided according to an embodiment of the present invention. The frequency adjusting device includes a voltage droop detector and a frequency divider. The voltage droop detector receives a supply voltage, and compares the supply voltage with a lower threshold voltage to output a comparison result. The frequency divider receives a basic clock signal, and outputs a result clock signal according to the comparison result. When the supply voltage is greater than the lower threshold voltage, the frequency divider outputs a result of the basic clock signal divided by a first value as the result clock signal. When the supply voltage is smaller than lower threshold voltage, the frequency divider outputs a result of dividing the basic clock signal by a second value as the result clock signal.

A frequency adjusting device is provided according to another embodiment of the present invention. The frequency adjusting device includes a sample digital circuit module, a delay test circuit, a delay status determiner and a frequency divider. The sample digital circuit module receives a switching signal to output a sample digital circuit module output signal. The delay test circuit includes a delay circuit and an XOR circuit. The delay circuit receives the sample digital circuit module output signal and delays the sample digital circuit module output signal by at least one period. The XOR circuit receives the sample digital circuit module output signal and the delayed sample digital circuit module output signal to perform an XOR operation to output a first operation result. The delay status determiner receives the first operation result and outputs a frequency dividing indication signal. The frequency divider receives the frequency divider indication signal to determine a frequency dividing value, and divides a basic clock signal by the frequency dividing value to output a result clock signal.

A frequency divider is provided according to another embodiment of the present invention. The frequency divider includes a mask clock generator and a frequency dividing circuit. The mask clock generator receives a basic clock signal and a down-conversion indication signal. The down-conversion indication signal includes a down-conversion starting pulse and a down-conversion ending pulse. The mask clock generator outputs a mask clock, which suppresses potential switching during a period between the down-conversion starting pulse and the down-conversion ending pulse. The frequency dividing circuit includes a plurality of D-flip-flops, which use the mask clock as a trigger input. The frequency dividing circuit outputs a result clock signal.

A method for suppressing noises during a frequency switching period is provided according to another embodiment of the present invention. The method includes: comparing a supply voltage with a lower threshold voltage to output a comparison result; delaying the comparison result by at least one period of a basic clock signal to generate a first delayed comparison result signal; delaying the first delayed comparison result signal by at least one period of the basic clock signal to generate a second delayed comparison result signal; performing an XOR operation on the comparison result and the second delayed comparison result signal to generate a down-conversion indication signal, which includes a down-conversion starting pulse and a down-conversion ending pulse; performing an XOR operation on the down-conversion indication signal and the basic clock signal to generate a mask clock, which suppresses potential switching of the basic clock signal during a period between the down-conversion starting pulse and the down-conversion ending pulse; and down-converting the mask clock according to the down-conversion indication signal.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1A:
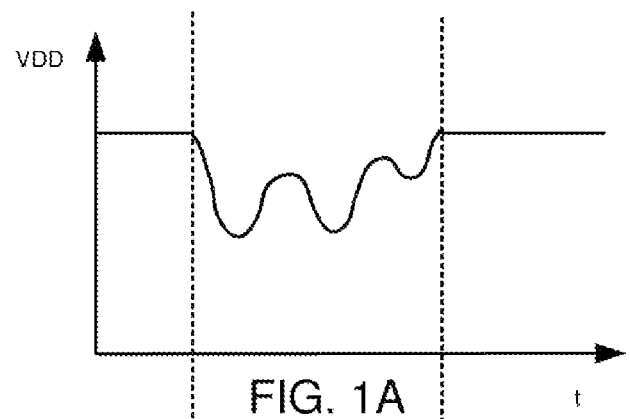
FIG. 1A shows a supply voltage that is temporarily unstable.
Figure 1B:
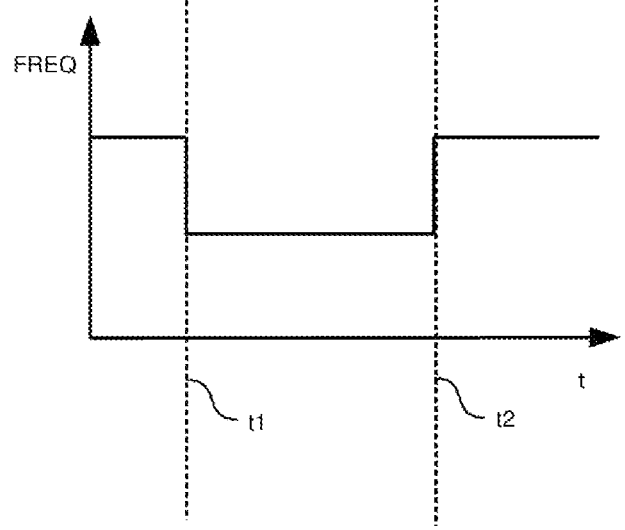
FIG. 1B is a schematic diagram of down-conversion performed in a period with respect to changes in a supply voltage.

FIG. 1A shows a supply voltage that is temporarily unstable. A supply voltage VDD provided to a digital circuit may become temporarily unstable or may drop due to various reasons. For example, in FIG. 1A, between the time point t1 and the time point t2, the supply voltage VDD drops and becomes unstable. FIG. 1B shows down-conversion performed in a period with respect to changes in the supply voltage. Referring to FIG. 1B, in one embodiment, during the period between the time point t1 and the time point t2, a clock of a digital circuit may be down-converted by using a frequency adjusting device. Thus, the digital circuit is ensured to function normally without generating errors that may be caused by a sudden voltage droop. Further, it is another object of the present invention to down-convert the frequency of a clock within an extremely short period upon detecting an unstable supply voltage.

Figure 2A:
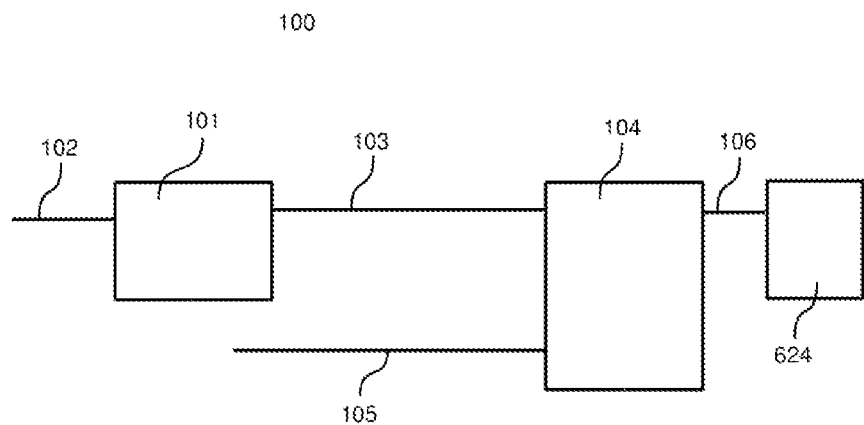
FIG. 2A is a frequency adjusting device according to an embodiment.

FIG. 2A shows a frequency adjusting device 100 according to an embodiment of the present invention. The frequency adjusting device 100 includes a voltage droop detector 101 and a frequency divider 104. The voltage droop detector 101 receives a supply voltage 102, and compares the supply voltage 102 with a lower threshold voltage to output a comparison result 103. The frequency divider 104 receives a basic clock signal 105, and outputs a result clock signal 106 according to the comparison result 104. When the supply voltage 102 is greater than the lower threshold voltage, the frequency divider 104 outputs the basic clock signal 105 as the result clock signal. When the supply voltage 102 is smaller than the lower threshold voltage, the frequency divider 104 outputs a result of dividing the frequency of the basic clock signal 105 as the result clock signal 106. The voltage droop detector 101 may be a comparator. The lower threshold voltage may be selected from a plurality of voltage values. The result clock signal may be used by a subsequent digital circuit 624, which may be, for example, a central processing unit (CPU).

Figure 2B:
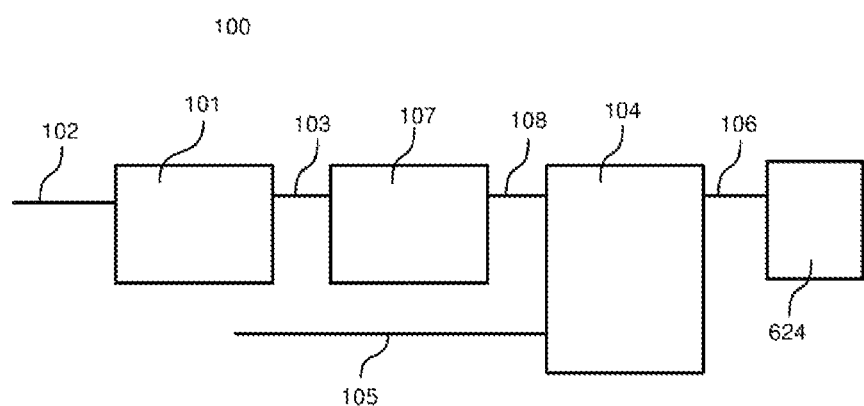
FIG. 2B is a frequency adjusting device according to another embodiment.
Figure 6:
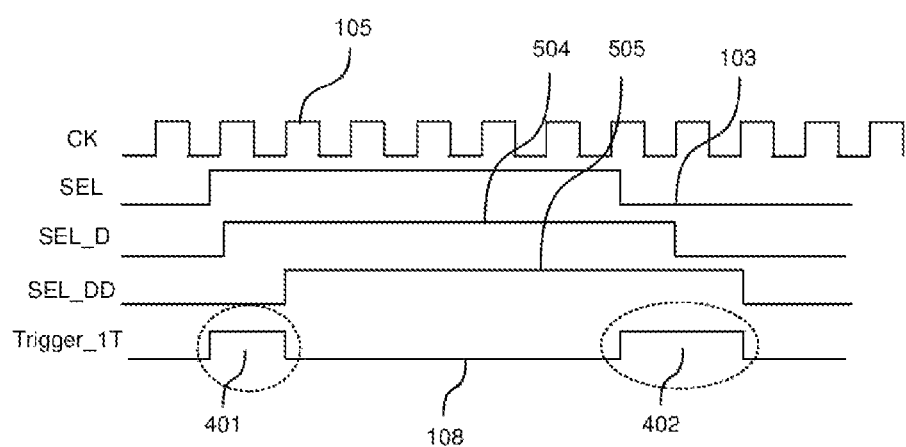
FIG. 6 is a waveform diagram of associated signals for generating a down-conversion indication signal.

In one embodiment, referring to FIG. 2B and FIG. 6, the frequency adjusting device 100 further includes a frequency dividing signal generator 107, which generates a down-conversion indication signal 108 according to the comparison result 103. The down-conversion indication signal 108 includes a down-conversion starting pulse 401 and a down-conversion ending pulse 402.

Referring to FIG. 2A, FIG. 2B, FIG. 5 and FIG. 6, the frequency dividing signal generator 107 receives the comparison result 103 (SEL) from the voltage droop detector 101. When the comparison result 103 is at a low level, it means that the supply voltage 102 is normal. When the comparison result 103 is at a high level, it means that the supply voltage 102 is lower than the lower threshold, and the basic clock signal 105 needs to be immediately down-converted to ensure no error is incurred in the subsequent digital circuit.

Figure 5:
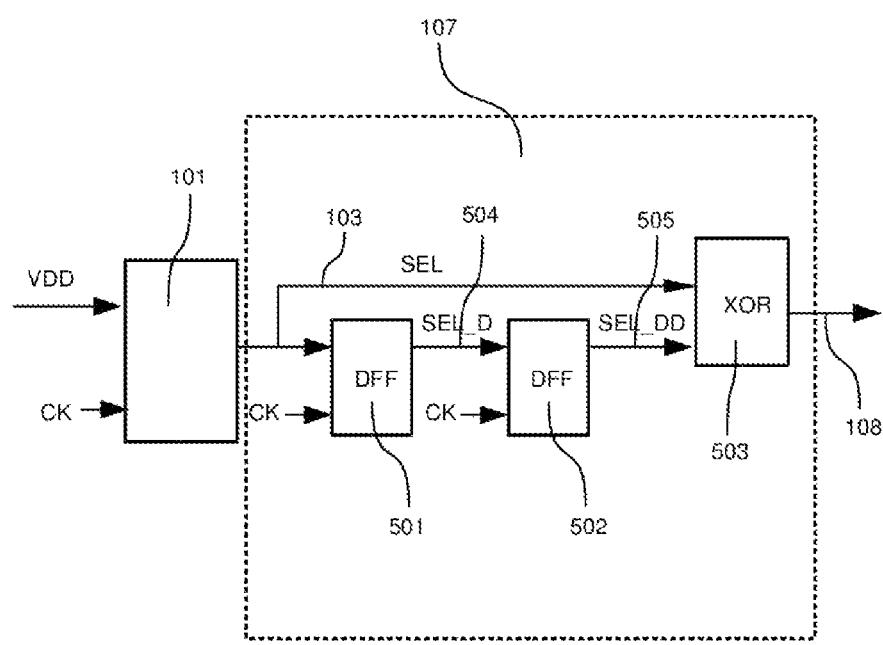
FIG. 5 is a frequency dividing signal generator according to an embodiment.

In one embodiment, referring to FIG. 2A, FIG. 2B and FIG. 5, the frequency dividing signal generator 107 includes a first D-flip-flop 501, a second D-flip-flop 502, and an XOR gate 503. The first D-flip-flop 501 receives the comparison result 103, and has its output end connected to an input end of the second D-flip-flop 502. The XOR gate 503 receives the comparison result 103 and an output of the second D-flip-flop 502 to perform an XOR operation to output the down-conversion indication signal 108.

Referring to FIG. 5 and FIG. 6, the first D-flip-flop 501 delays the comparison result 103 for the first time to generate a first delayed comparison result signal 504 (SEL_D). The second D-flip-flop 502 delays the first delayed comparison result signal 504 for the second time to generate a second delayed comparison result signal 502 (SEL_DD). The second delayed comparison result signal 505 is delayed by one more cycle compared to the first delayed comparison result signal 504. Next, the XOR gate 503 receives the comparison result 103 and the second delayed comparison result signal 505 to perform an XOR operation to generate the down-conversion indication signal 108. The down-conversion signal 108 includes a down-conversion starting pulse 401 and a down-conversion ending pulse 402.

Figure 3:
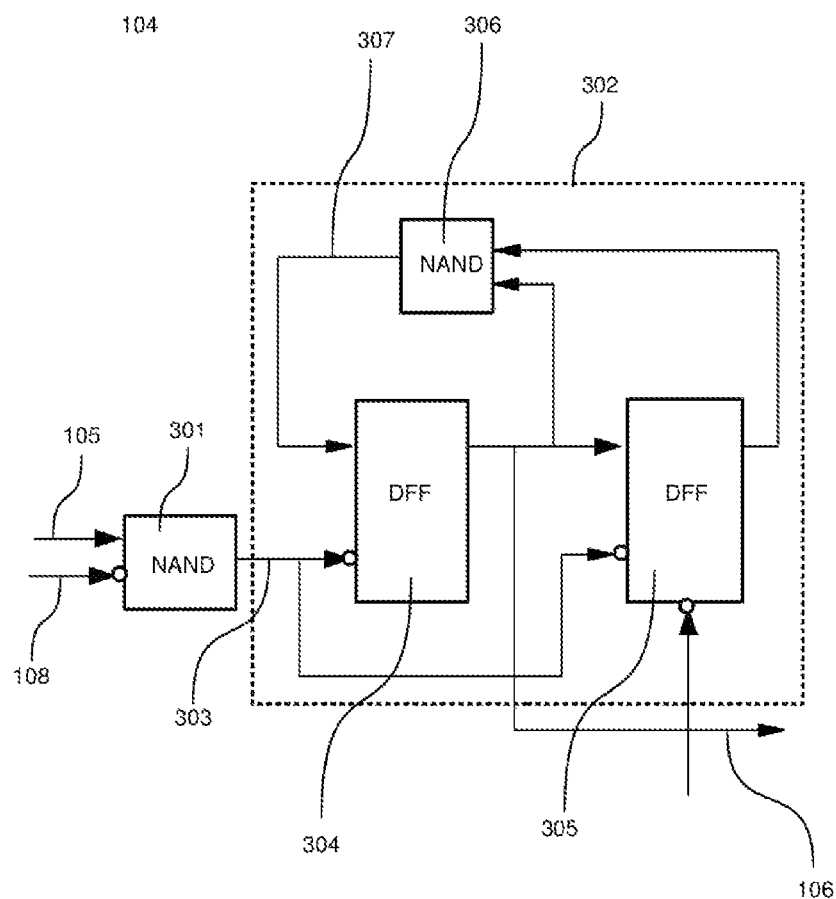
FIG. 3 is a frequency divider according to an embodiment.

In one embodiment, referring to FIG. 2A, FIG. 2B and FIG. 3, the frequency divider 104 includes a mask clock generator 301 and a frequency dividing circuit 302. The mask clock generator 301 receives a basic clock signal 105 and a down-conversion indication signal 108. Referring to FIG. 6, the down-conversion indication signal 108 includes a down-conversion starting pulse 401 and a down-conversion ending pulse 402. The mask clock generator 301 outputs a mask clock 303, which suppresses potential switching during a period between the down-conversion starting pulse 401 and the down-conversion ending pulse 402. The frequency dividing circuit 302 includes a plurality of D-flip-flops 304 and 305, which use the mask clock 303 as a trigger input. The frequency dividing circuit 303 outputs a result clock signal 106.

In one embodiment, the D-flip-flops include a first D-flip-flop 304 and the second D-flip-flop 305. The first D-flip-flop 304 uses the mask clock 303 as a negative edge trigger input, and the second D-flip-flop 305 uses the mask clock 303 as a negative edge trigger input. The first D-flip-flop 304 has its output end connected to an input end of the second D-flip-flop 305. In one embodiment, the frequency divider 104 further includes a NAND gate 306. The NAND gate 306 receives the output of the first D-flip-flop 304 and the output of the second D-flip-flop 305 to perform a NAND operation to output an NAND operation result 307, which is then inputted into the first D-flip-flop 304.

Figure 4:
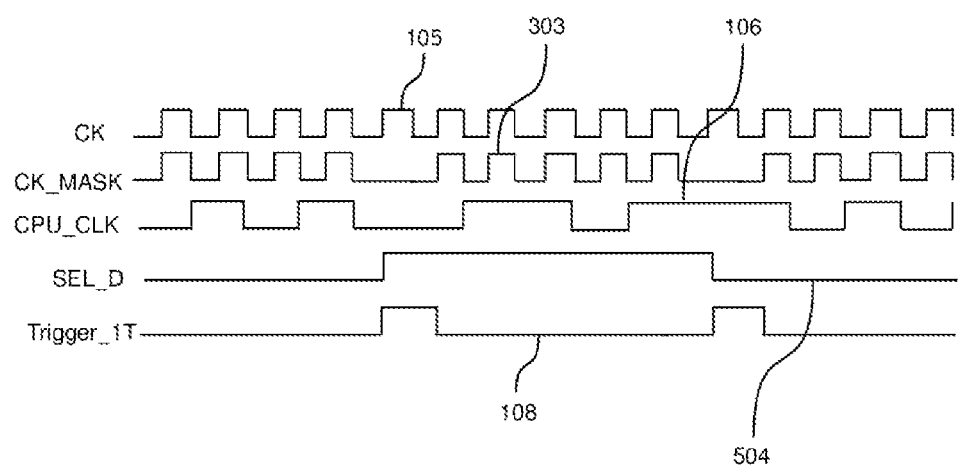
FIG. 4 is a waveform diagram of signals associated with a down-conversion indication signal.

Referring to FIG. 3 and FIG. 4, the mask clock generator 301 may be a NAND gate. The down-conversion indication signal 108 is inverted and inputted into the NAND gate, and the basic clock signal 105 is also inputted into the NAND gate. The NAND gate performs a NAND operation and outputs the mask clock 303. The mask clock 303 is at a low level during the period between the down-conversion starting pulse 401 and the down-conversion ending pulse 401 because of the NAND operation. That is to say, the mask clock 303 suppresses potential switching during the period between the down-conversion starting pulse 401 and the down-conversion ending pulse 401. Next, the mask clock 303 is frequency divided to generate the result clock signal 106. Because the mask clock 303 suppresses potential switching during the period between the down-conversion starting pulse 401 and the down-conversion ending pulse 401, surges and noises are prevented at the instants of starting and ending the frequency dividing. Further, only one period of the basic clock signal is needed from the moment of having detected the abnormal supply voltage to the moment of starting the down-conversion, hence providing an extremely prompt response.

Figure 7:
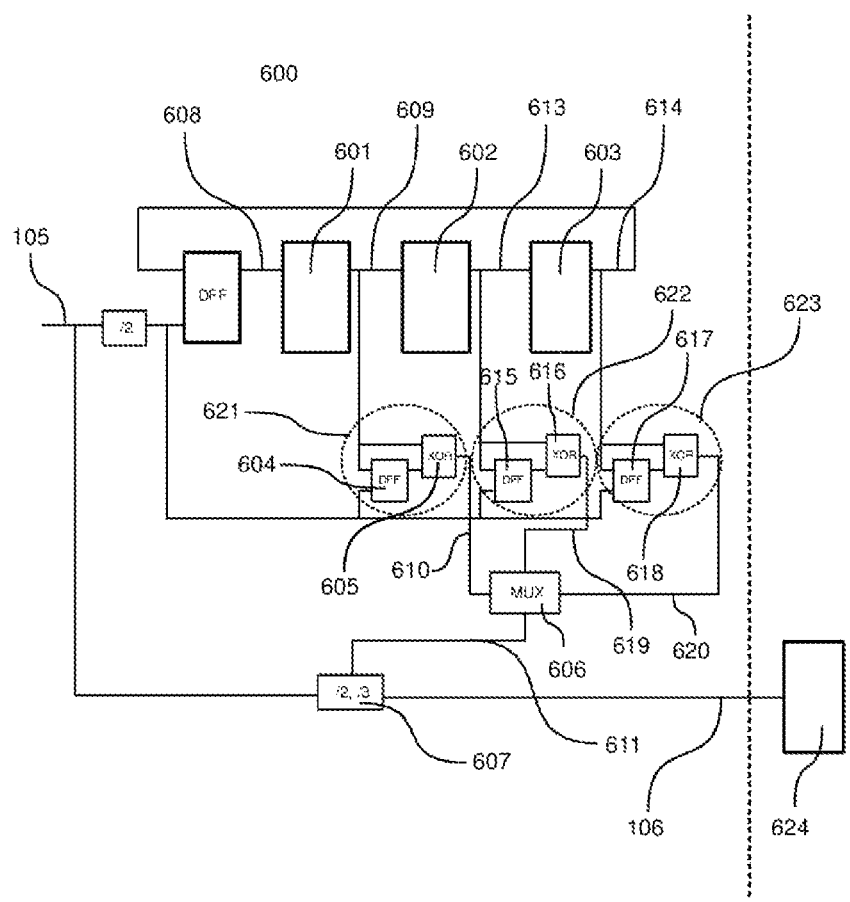
FIG. 7 is a frequency adjusting device according to an embodiment.

Referring to FIG. 4 and FIG. 7, in one embodiment, the frequency of the result clock signal 106 is ½ of that of the basic clock signal 105 before the down-conversion starting pulse 401 begins. After the down-conversion starting pulse 401, the frequency of the result clock signal 106 is ⅓ of that of the basic clock signal 105. Referring to FIG. 7, the basic clock signal 105 is down-converted to having ½ of the original frequency of the basic clock signal 105 before entering the sample digital circuit module 601. The frequency divider 607 has two choices—one is dividing the frequency of the basic clock signal 105 by 2, and the other is dividing the frequency of the basic clock signal 105 by 3. Thus, in normal conditions, the frequency divider 607 divides the basic clock signal 105 by 2 and outputs the result as the result clock signal 106. During the period between the down-conversion starting pulse 401 and the down-conversion ending pulse 402, the frequency divider 607 divides the basic clock signal 105 by 3, and the result is outputted as the result clock signal 106.

Referring to FIG. 7, a frequency adjusting device 600 includes a sample digital circuit module 601, a delay test circuit 621, a delay status determiner 606 and a frequency divider 607. The sample digital circuit module 601 receives a switching signal 608 to output a sample digital circuit module output signal 609. The delay test circuit 621 includes a delay circuit 604 and an XOR circuit 605. The delay circuit 604 receives the sample digital circuit module output signal 609 and delays the sample digital circuit module output signal 609 by at least one cycle. The XOR circuit 605 receives the sample digital circuit module output signal 609 and the delayed sample digital circuit module output signal 609 to perform an XOR operation to output a first operation result 610.

If the output of the XOR circuit 605 indicates that high levels of the sample digital circuit module output signal 609 and the delayed sample digital circuit module output signal 609 overlap, it means that the delay in the sample digital circuit module output signal 609 is not severe, and down-conversion may not be needed. If the output of the XOR circuit 605 indicates high levels of the sample digital circuit module output signal 609 and the delayed sample digital circuit module output signal 609 do not overlap, it means that the delay in the sample digital circuit module output signal 609 is severe, and down-conversion is then needed.

The delay status determiner 606 receives the operation result 610 and outputs a frequency dividing indication signal 611. The frequency divider 607 receives the frequency dividing indication signal 611 to determine a frequency dividing value, and divides a basic clock signal 105 by the frequency dividing value to output a result clock signal 106.

In one embodiment, the sample digital circuit module 601 is a first sample digital circuit module 601, and the frequency adjusting device 600 further includes a second sample digital circuit module 602 and a third sample digital circuit module 603. The first sample digital circuit module 601 has its output end connected to an input end of the second sample digital circuit module 602, and the second sample digital circuit module 602 has its output end connected to an input end of the third sample digital circuit module 603. The first sample digital circuit module 601 may be a critical path duplicated from a digital circuit 624. Similarly, the second sample digital circuit module 602 may be a critical path duplicated from a digital circuit 624, and the third sample digital circuit module 603 may be a critical path duplicated from a digital circuit 624.

In one embodiment, the delay test circuit 621 is a first delay test circuit 621, and the frequency adjusting device 600 further includes a second delay test circuit 622 and a third delay test circuit 623. The second sample digital circuit module 602 has its output end connected to the second delay test circuit 622, and the third sample digital circuit module 603 has its output end connected to the third delay test circuit 623. The second sample digital circuit module 602 outputs a second sample digital circuit module output signal 613, and the third sample digital circuit module 603 outputs a third sample digital circuit module output signal 614.

In one embodiment, the second delay test circuit 622 includes a delay circuit 615 and an XOR circuit 616. The delay circuit 615 receives the second sample digital circuit module output signal 613 and delays the second sample digital circuit output signal 613 by at least one cycle. The XOR circuit 616 receives the second sample digital circuit module output signal 613 and the delayed second sample digital circuit output signal 613 to perform an XOR operation to output a second operation result 619.

In one embodiment, the third delay test circuit 623 includes a delay circuit 617 and an XOR circuit 618. The delay circuit 617 receives the third sample digital circuit module output signal 614 and delays the third sample digital circuit module output signal 614 by at least one cycle. The XOR circuit 618 receives the third sample digital circuit module output signal 614 and the delayed third sample digital circuit module output signal 614 to perform an XOR operation to output a third operation result 620. In one embodiment, the delay status determiner 606 is a multiplexer. The multiplexer further receives the second operation result 619 and the third operation result 620 to output the frequency dividing indication signal 611. Operation details of the second delay test circuit 622 and the third delay test circuit 623 are similar to those of the first delay test circuit 621, and shall be omitted herein.

The first operation result 610, the second operation result 619 and the third operation result 620 may be used by a voltage droop detector 101 to select different lower threshold voltages. For a longer critical path, the voltage droop needs to be controlled with high precision, and so the third operation result 620 may be used to select a greater lower threshold voltage. For a shorter critical path, highly precise control on the voltage droop is not necessary, and so the first operation result 610 may be used to select a smaller lower threshold voltage. Details of implementing the delay test circuits, the delay circuits and the XOR circuit are generally known to one person skilled in the art, and shall be omitted herein.

Referring to FIG. 2 and FIG. 7, a frequency adjusting device 100 according to an embodiment includes a voltage droop detector 101 and a frequency divider 104. The voltage droop detector 101 receives a supply voltage 102, and compares the supply voltage 102 with a lower threshold voltage to output a comparison result 103. The frequency divider 104 receives a basic clock signal 105, and outputs a result clock signal 106 according to the comparison result 103. When the supply voltage 102 is greater than the lower threshold voltage, the frequency divider 104 outputs a result of dividing the basic clock signal 105 by a first value as the result clock signal 106. When the supply voltage 102 is smaller than the lower threshold voltage, the frequency divider 104 outputs a result of dividing the basic clock signal 105 by a second value as the result clock signal 106. In one embodiment, the first value is 2 and the second value is 3. In another embodiment, the first value is 1 and the second value is 2. When the first value is 1, frequency dividing is not needed, and the basic clock signal 105 may be directly outputted as the result clock signal 106.

Figure 8:
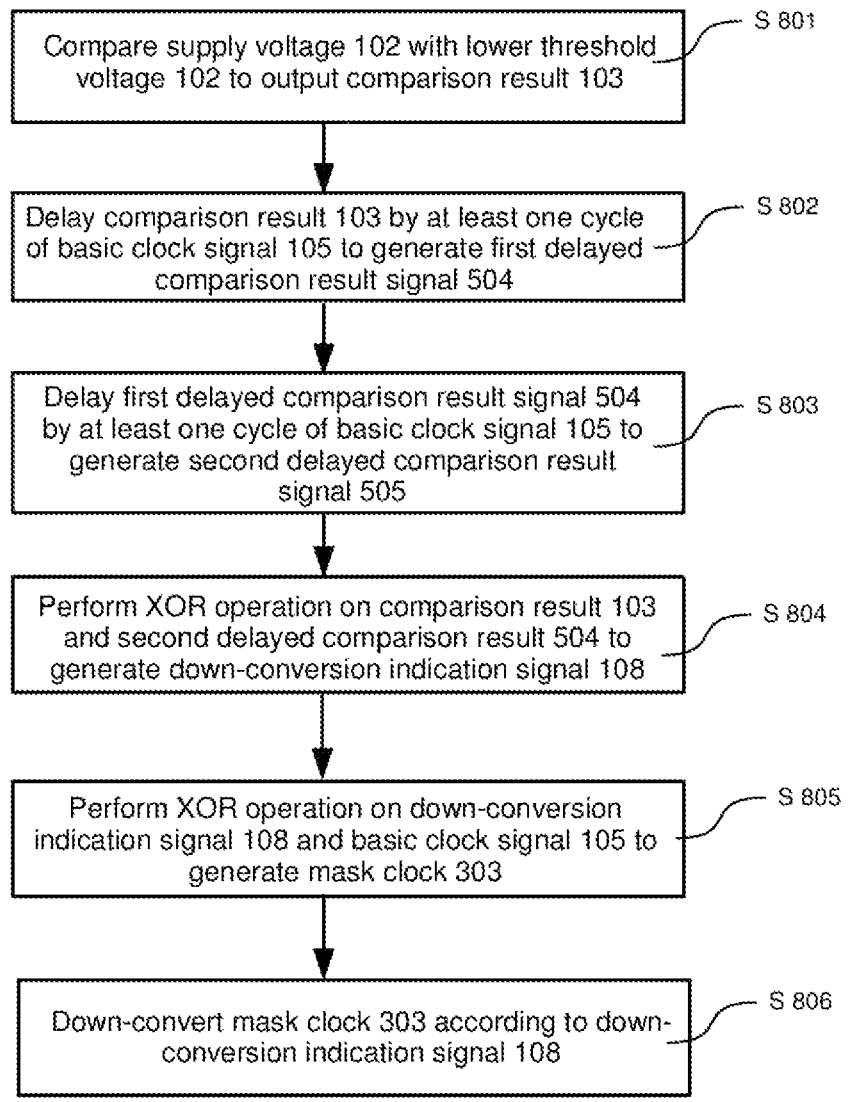
FIG. 8 is a flowchart of a method for suppressing noises during a frequency switching period.

Referring to FIG. 6 and FIG. 8, the present invention discloses a method for suppressing noises during a frequency switching period according to an embodiment. The method includes following steps. A supply voltage 102 is compared with a lower threshold voltage to output a comparison result (step S801). The comparison result 103 is delayed to generate a first delayed comparison result signal 504 (step S802). The first delayed comparison result signal 504 is delayed by at least one cycle of the basic clock signal 105 to generate a second delayed comparison result signal 505 (step 803). An XOR operation is performed on the comparison result 103 and the second delayed comparison result 505 to generate a down-conversion indication signal 108 (step S804). The down-conversion indication signal 108 includes a down-conversion starting pulse 401 and a down-conversion ending pulse 402. An XOR operation is performed on an inverted signal of the down-conversion indication signal 108 and the basic clock signal 105 to generate a mask clock 303 (step S805). The mask clock 303 suppresses potential switching of the basic clock signal 105 during a period between the down-conversion starting pulse 401 and the down-conversion ending pulse 402. The mask clock 303 is down-converted according to the down-conversion indication signal 108 (step S806). Given that the same effects are achieved, the above steps do not need to be performed according to a fixed order, and some of the steps may be exchanged.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A frequency adjusting device, comprising:
   a voltage droop detector, receiving a supply voltage, comparing the supply voltage with a lower threshold voltage to output a comparison result; and
   a frequency divider, receiving one basic clock signal, outputting a result clock signal according to the comparison result;
   wherein, when the supply voltage is greater than the lower threshold voltage, the frequency divider outputs a result of the basic clock signal divided by a first value as the result clock signal; when the supply voltage is smaller than the lower threshold voltage, the frequency divider outputs a result of the basic clock signal divided by a second value as the result clock signal, wherein the first value is lower than the second value;
   wherein the frequency adjusting device further comprises a frequency dividing signal generator, and the frequency dividing signal generator generates a down-conversion indication signal that comprises a down-conversion starting pulse and a down-conversion ending pulse;
   wherein the frequency divider comprises a first D-flip-flop, a second D-flip-flop and an XOR gate, the first D-flip-flop receives the comparison result and has its output end connected to an input end of the second D-flip-flop, and the XOR gate receives the comparison result and an output of the second D-flip-flop to perform an XOR operation to output the down-conversion indication signal.

2. A frequency adjusting device, comprising:
   a voltage droop detector, receiving a supply voltage, comparing the supply voltage with a lower threshold voltage to output a comparison result; and
   a frequency divider, receiving one basic clock signal, outputting a result clock signal according to the comparison result;
   wherein, when the supply voltage is greater than the lower threshold voltage, the frequency divider outputs a result of the basic clock signal divided by a first value as the result clock signal; when the supply voltage is smaller than the lower threshold voltage, the frequency divider outputs a result of the basic clock signal divided by a second value as the result clock signal, wherein the first value is lower than the second value;
   wherein the frequency divider comprises:
   a mask clock generator, receiving the basic clock signal and a down-conversion indication signal, the down-conversion indication signal comprising a down-conversion starting pulse and a down-conversion ending pulse, the mask clock generator outputting a mask clock that suppresses potential switch during a period between the down-conversion starting pulse and the down-conversion ending pulse; and
   a frequency dividing circuit, comprising a plurality of D-flip-flops that utilize the mask clock as a trigger input, the frequency dividing circuit outputting the result clock signal.

3. The frequency adjusting device according to claim 1, wherein the first value is 2 and the second value is 3.

* * * * *